(12) United States Patent
Ono et al.

(10) Patent No.: US 12,349,245 B2
(45) Date of Patent: Jul. 1, 2025

(54) VAPORIZER

(71) Applicant: LINTEC CO., LTD., Shiga (JP)

(72) Inventors: Hirofumi Ono, Shiga (JP); Tatsuhiko Furukado, Shiga (JP)

(73) Assignee: LINTEC CO., LTD., Shiga (JP)

( * ) Notice: Subject to any disclaimer, the term of this patent is extended or adjusted under 35 U.S.C. 154(b) by 806 days.

(21) Appl. No.: 17/753,094

(22) PCT Filed: Mar. 5, 2020

(86) PCT No.: PCT/JP2020/009385
§ 371 (c)(1),
(2) Date: Feb. 18, 2022

(87) PCT Pub. No.: WO2021/033353
PCT Pub. Date: Feb. 25, 2021

(65) Prior Publication Data
US 2022/0338308 A1 Oct. 20, 2022

(30) Foreign Application Priority Data

Aug. 21, 2019 (JP) ................................. 2019-151125

(51) Int. Cl.
*H05B 3/48* (2006.01)
*H01L 21/67* (2006.01)

(52) U.S. Cl.
CPC ......... *H05B 3/48* (2013.01); *H01L 21/67017* (2013.01); *H05B 2203/021* (2013.01)

(58) Field of Classification Search
None
See application file for complete search history.

(56) References Cited

FOREIGN PATENT DOCUMENTS

| JP | H11-28349 A | 2/1999 |
| JP | 2001-337240 A | 12/2001 |
| JP | 2009-041794 A | 2/2009 |
| JP | 2016143798 A * | 8/2016 |
| JP | 6203207 B2 | 9/2017 |
| KR | 10-2012-0039174 A | 4/2012 |
| KR | 10-2019-0022183 A | 3/2019 |

OTHER PUBLICATIONS

Translation of JP-2016143798-A (Year: 2016).*
PCT, International Search Report for the corresponding patent application No. PCT/JP2020/009385, dated Jun. 16, 2020, with English translation.
TIPO, Office Action in the corresponding Taiwanese Patent Application No. 109108141, dated Oct. 28, 2020, with English translation.

* cited by examiner

*Primary Examiner* — Elizabeth M Kerr
(74) *Attorney, Agent, or Firm* — LUCAS & MERCANTI, LLP

(57) ABSTRACT

A vaporizer includes an atomizer, a vaporizer body, and a heating portion. The heating portion includes an inner heater block and an inner heater. An inner tube is made of a heat-resistant glass and has an outer diameter smaller than an inner diameter of the hollow vaporizer body. The inner heater block includes division pieces obtained by dividing the inner heater block along a center axis thereof and an elastic material. The elastic material is disposed between the division pieces and acts so as to press and urge the division pieces in separation directions and press them against an inner peripheral surface of the inner tube. The inner heater is embedded in each division piece.

2 Claims, 4 Drawing Sheets

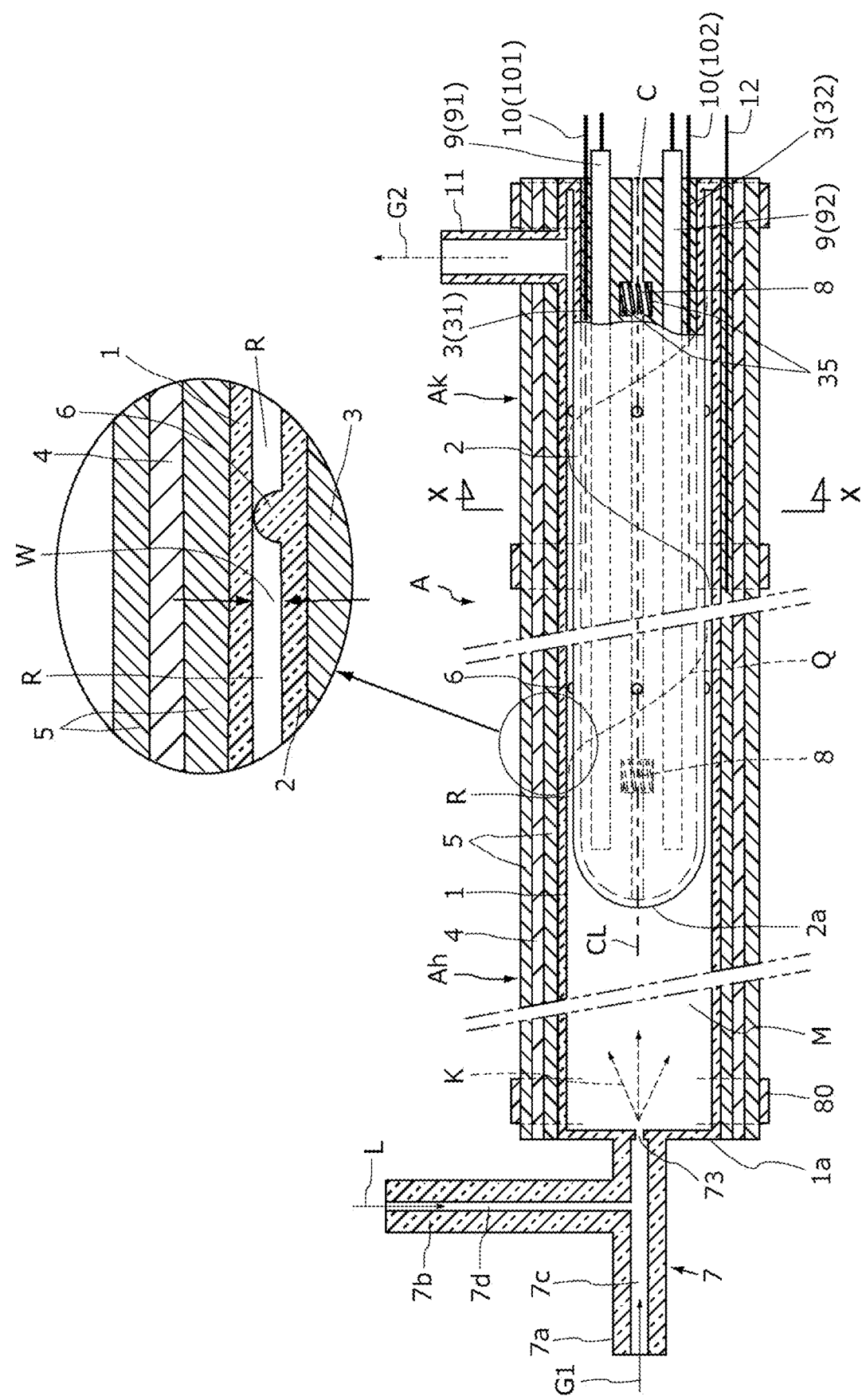
[FIG. 1]

[FIG. 2]
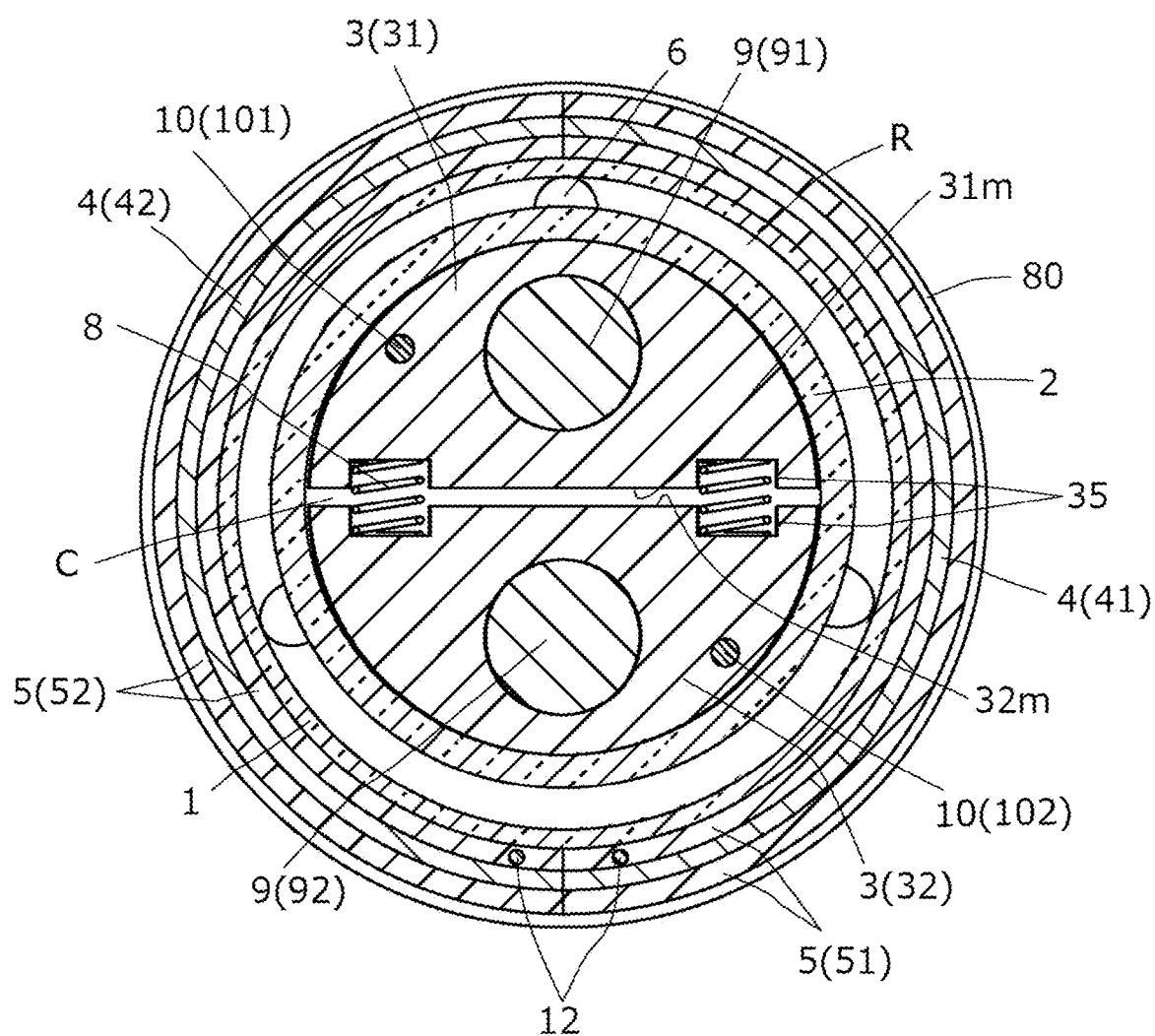

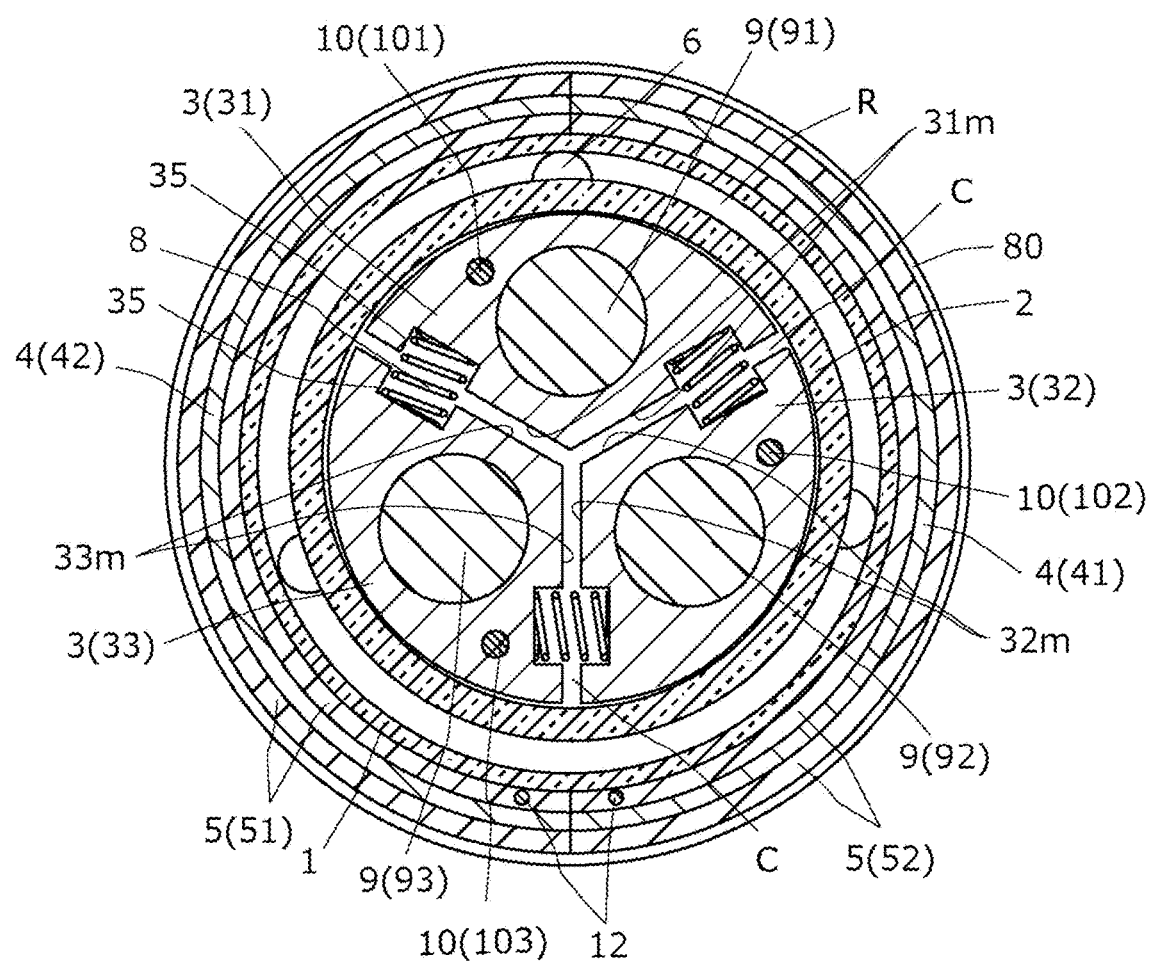
[FIG. 3]

[FIG. 4]
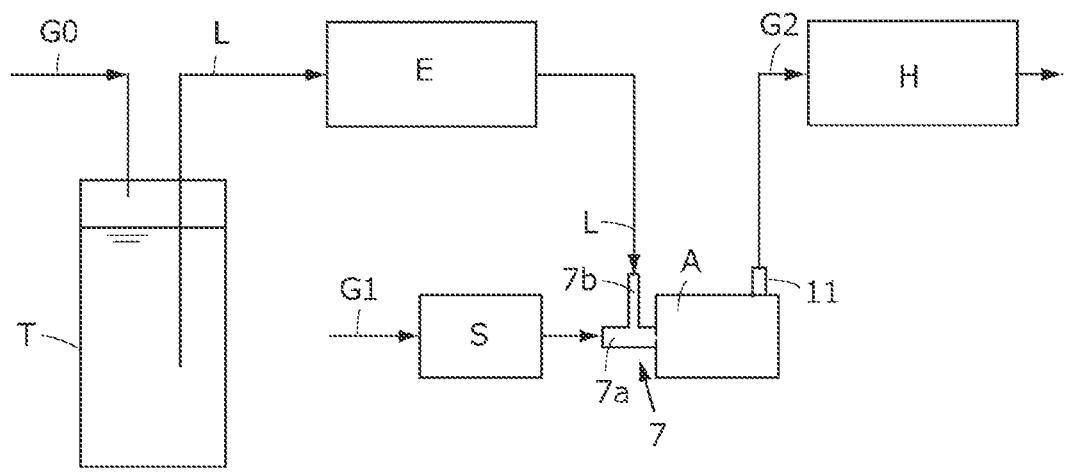

VAPORIZER

CROSS REFERENCE TO RELATED APPLICATION

This Application is a 371 of PCT/JP2020/009385 filed on Mar. 5, 2020, which in turn claims priority of Japanese patent application no. 2019-151125, filed on Aug. 21, 2019, and the above applications are incorporated herein by reference.

TECHNICAL FIELD

The present invention relates to a vaporizer made of glass, the vaporizer being excellent in heat conduction and being intended particularly to manufacture semiconductors and to form optical waveguides.

BACKGROUND ART

As types of thermal oxidation methods for semiconductor materials such as Si and SiC, there are wet oxidation and dry oxidation. In the wet oxidation, water is used. $H_2O$ in the form of gas (water vapor) is caused to flow into a furnace, and oxygen in the water is used for growth of an oxide film. This characteristic leads to a high oxidation rate. Therefore, this method is used if a large film thickness is needed. Meanwhile, in the dry oxidation, oxygen gas is used for growth of an oxide film. This characteristic leads to a low growth rate in contrast with the wet oxidation. In recent years, hydrogen peroxide ($H_2O_2$) has been used instead of water ($H_2O$) in order to further increase the growth rate of an oxide film. On the other hand, purposes other than the purpose regarding semiconductors include formation of optical waveguides (see Patent Literature 1). In this case, an oxidation method using $H_2O$ requires a long deposition time for deposition of silicon dioxide ($SiO_2$) having a thickness of 10 to 25 μm. If hydrogen peroxide ($H_2O_2$) is used instead of $H_2O$, the time can be significantly shortened.

To this end, a large amount of hydrogen peroxide solution needs to be vaporized and sent into a reaction furnace. As a device intended for this purpose, devices such as one described in Patent Literature 1 have been proposed.

CITATION LIST

Patent Literature

[PTL 1] Japanese Laid-Open Patent Publication No. 2001-337240
[PTL 2] Japanese Patent No. 6203207

SUMMARY OF INVENTION

Technical Problem

The vaporizer for vaporizing a hydrogen peroxide solution and generating oxidizing gas described in Patent Literature 1 is such that: the lower half, in the vaporizer, of a hollow spherical container that contains the hydrogen peroxide solution and that is similar to a flask is covered with a heater from outside; and the hollow spherical container is heated to 100 to 130° C. Water vapor gas that contains hydrogen peroxide gas obtained by vaporization flows into a reaction furnace through a gas supply tube. This device merely heats and vaporizes the hydrogen peroxide solution, and the device has a drawback that the concentration of hydrogen peroxide changes in association with evaporation of the hydrogen peroxide solution in the vaporizer. Furthermore, it is difficult to enable the flow rate of hydrogen peroxide to be kept fixed, and moreover, the flow rate indicating how much hydrogen peroxide is flowing is unclear.

Considering this, the present inventors proposed an invention described in Patent Literature 2. This vaporizer includes: an atomizer which atomizes and spouts a liquid material; a hollow outer tube to which a spraying port of the atomizer is connected; an inner tube accommodated in the outer tube; an outer heater block disposed outside of the outer tube; an inner heater block inserted into the inner tube; an outer heater embedded in the outer heater block; and an inner heater embedded in the inner heater block.

The portions of this vaporizer other than both heater blocks and both heaters are made of quartz glass in order to prevent contamination. The above both heater blocks are made of aluminum having favorable heat conduction property.

A space that is located in the outer tube and that faces the spraying port of the atomizer is an atomization space, a gap that is located between the outer tube and the inner tube and that leads to the atomization space is a vaporization gap, and the above liquid material flows in the vaporization gap, to be heated and vaporized.

The inner heater block is made of aluminum having a remarkably larger thermal expansion coefficient than quartz. Thus, in order to prevent the inner tube made of quartz from being damaged owing to thermal expansion of the inner heater block made of aluminum at the time of setting to a high temperature during this heating operation, the outer diameter of the inner heater block is set to be smaller than the inner diameter of the inner tube made of quartz, and a large space is ensured to the extent that the inner tube is not influenced by the thermal expansion. However, since this gap is an air space having high heat insulating property, heat of the inner heater is less likely to be transmitted from the inner heater block to the inner tube, whereby vaporization performance is remarkably impaired.

In order to ameliorate this drawback, a heat-conductive paste for filling the gap between the inner heater block and the inner tube made of quartz is applied in an actual product. However, as the flow rate of the liquid material to be vaporized is set to be higher, a higher temperature is needed, and setting to a high temperature leads to evaporation of a solvent which is a component of the heat-conductive paste so that only the solid component remains. Consequently, a gap resulting from evaporation of the solvent is filled with air having high heat insulating property. This filling causes a drawback that the efficiency of heat conduction remarkably decreases so that the vaporization performance decreases, whereby a target flow rate of the liquid material to be vaporized is not obtained.

The present invention has been made in view of these conventional drawbacks, and an object of the present invention is to provide a vaporizer in which, to realize high-temperature heating of a liquid material, a heat-conductive paste to be used is reduced as much as possible and close-contact property between an inner heater block made of a metal (aluminum) and an inner tube made of a heat-resistant glass (quartz) is improved so that heat conduction from the inner heater block heated by an inner heater is improved.

Solution to Problem

An invention disclosed in claim 1 is directed to a vaporizer A having excellent heat conduction property, the vaporizer A including:

an atomizer 7 configured to atomize and spout a liquid material L;

a vaporizer body Ah which is hollow, the vaporizer body Ah having one end to which a spraying port 73 of the atomizer 7 is connected, the vaporizer body Ah having, at another end thereof, an exit nozzle 11 which is an exit for vaporization gas G2; and a heating portion Ak accommodated in the vaporizer body Ah, wherein the heating portion Ak includes an inner tube 2 made of a heat-resistant glass, the inner tube 2 having an outer diameter smaller than an inner diameter of the vaporizer body Ah, the inner tube 2 having a front end head portion 2a which is an insertion end and which is closed, an inner heater block 3 inserted in the inner tube 2, and an inner heater 9 embedded in the inner heater block 3, the exit nozzle 11 is provided so as to be in communication with a vaporization gap R formed between an inner peripheral surface of the vaporizer body Ah and an outer peripheral surface of the inner tube 2, the inner heater block 3 includes a plurality of division pieces 31 to 3n obtained by dividing the inner heater block 3 along a center axis CL of the inner heater block 3 and an elastic material 8, the elastic material 8 is disposed between the division pieces 31 to 3n and acts so as to press and urge the division pieces 31 to 3n in separation directions and press outer peripheral surfaces of the division pieces 31 to 3n against an inner peripheral surface of the inner tube 2, and the inner heater 91 to 9n is embedded in each division piece 31 to 3n.

Claim 2 is directed to the vaporizer A disclosed in claim 1, wherein the heat-resistant glass is quartz glass.

Advantageous Effects of Invention

The vaporizer A according to the present invention has the above configuration, and thus, even if the division pieces 31 to 3n undergo thermal expansion at the time of temperature rise, the elastic material 8 contracts according to the thermal expansion so as to absorb the expansion, and moreover, the elastic material 8 presses the outer peripheral surfaces of the division pieces 31 to 3n against the inner peripheral surface of the inner tube 2. Consequently, the inner tube 2 and the division pieces 31 to 3n composing the inner heater block 3 can be kept in a state of being in close contact with each other without damaging the inner tube 2 made of a heat-resistant glass.

BRIEF DESCRIPTION OF DRAWINGS

FIG. 1 is a partially-cross-sectional front view of an embodiment of the present invention.

FIG. 2 is a cross-sectional view of a first embodiment, taken along a line X-X in FIG. 1.

FIG. 3 is a cross-sectional view of a second embodiment, taken along the said line in FIG. 1.

FIG. 4 is a configuration diagram of a semiconductor manufacturing device in which the vaporizer according to the present invention is used.

DESCRIPTION OF EMBODIMENTS

Hereinafter, the present invention will be described with reference to the drawings. The vaporizer A is composed of an atomizer 7, a vaporizer body Ah, and a heating portion Ak.

The above vaporizer body Ah is composed of a hollow cylindrical outer tube 1, a divided outer heater block 5, an outer heater 4, and an exit nozzle 11. Furthermore, the vaporizer body Ah is, as necessary, provided with a temperature sensor 12 as described later.

The above heating portion Ak is composed of an inner tube 2, an inner heater block 3, an inner heater 9, and a temperature sensor 10.

A liquid material L to which the vaporizer A is applicable may be any liquid material as long as the liquid material is used after being vaporized (for example, any type of liquid material to be used for manufacturing semiconductors). Here, a hydrogen peroxide solution is used as the liquid material L. If the vaporizer A is for vaporizing a hydrogen peroxide solution and hydrogen-peroxide-containing water vapor gas (vaporization gas G2) having a very high purity is needed as in a semiconductor manufacturing device, portions with which the hydrogen-peroxide-containing water vapor gas (vaporization gas G2) is brought into contact (here, the atomizer 7, the outer tube 1, the inner tube 2, and the exit nozzle 11) are each made of a glass (for example, "quartz glass") that is not contaminated with the hydrogen-peroxide-containing water vapor gas (vaporization gas G2) in a high-temperature environment.

In other fields, heat-resistant glasses such as pyrex (registered trademark) glass can also be used.

The outer heater block 5 of the vaporizer body Ah has "n" pieces obtained by dividing a cylindrical member made of a metal (in the present embodiment, aluminum) along a center axis thereof, and the outer heater 4 and the temperature sensor 12 which are provided as necessary are embedded in the outer heater block 5. The outer heater 4 is also divided into "n" pieces correspondingly to the outer heater block 5, and the temperature sensor 12 is also inserted in each division piece of the outer heater block 5.

In FIG. 2 and FIG. 3, the outer heater block 5 is divided in the left-right direction into two pieces, and the outer heater 4 is, correspondingly to the outer heater block 5, also divided in the left-right direction into two pieces which are accommodated in the division pieces 51 and 52 of the outer heater block 5. The division pieces of the outer heater 4 are denoted by reference characters 41 and 42.

Fixation bands 80 that have tightening forces are fitted at several locations to outer peripheries of the division pieces 51 and 52 of the outer heater block 5 so that the entire inner peripheral surfaces of the division pieces are pressed against and brought into contact with the outer peripheral surface of the outer tube 1.

In this manner, attachment is performed such that the entire inner peripheral surface of the outer heater block 5 is in contact with the outer peripheral surface of the outer tube 1 made of a heat-resistant glass (for example, quartz glass).

The temperature sensor 12 may be provided to each of the division pieces 51 and 52 of the outer heater block 5.

As described above, the outer tube 1 is a cylindrical hollow tube having one end closed. A spraying gas tube 7a of the atomizer 7 (described later) is connected to the closed end 1a. The spraying gas tube 7a has an opened spraying port 73. Meanwhile, the exit nozzle 11 in communication with a vaporization gap R (described later) is connected to an outer peripheral surface, of the outer tube 1, that is on an opposite side to the closed end 1a.

The atomizer 7 is composed of: the spraying gas tube 7a connected to the end portion of the outer tube 1; and a liquid material introduction tube 7b tilted with respect to the spraying gas tube 7a at a right angle or an angle approximate to a right angle or, although not shown, toward a flow direction of an atomization gas. A main supply hole 7c through which the atomization gas G1 passes is drilled in the spraying gas tube 7a, and an auxiliary supply hole 7d in communication with the main supply hole 7c is drilled in the liquid material introduction tube 7b. The main supply hole 7c has an inner diameter larger than the inner diameter of the auxiliary supply hole 7d and has a narrowed exit that serves as the above spraying port 73. The exit portion of the spraying gas tube 7a of the atomizer 7 is connected to the outer tube 1.

The liquid material introduction tube 7b is connected to a liquid flow rate controller E (described later).

The inner tube 2 has a front end head portion 2a. The front end head portion 2a is on the insertion end side and closed so as to be formed in a hemispherical shape. Although the shape of the front end head portion 2a is a hemispherical shape in the embodiment shown in the drawing, the shape is, as a matter of course, not limited to a hemispherical shape and may be the shape of a spheroid surface, a paraboloid of revolution, or a circular cone.

Another end of the inner tube 2 is opened, and the inner heater block 3 is inserted from this opened end.

The inner heater block 3 is divided along an axial direction (center axis CL) thereof into a plurality of pieces. FIG. 2 shows an example in which the inner heater block 3 is divided into two pieces, and FIG. 3 shows an example in which the inner heater block 3 is divided into three pieces. The division pieces 31 to 3n are obtained by equal division. In the case of FIG. 2, each division piece has a cross section with a semicircular shape. In the case of FIG. 3, each division piece has a cross section with a fan shape. The number of pieces obtained by division is not limited. In the case where the inner heater block 3 is divided into two pieces, the division pieces are denoted by 31 and 32. In the case where the inner heater block 3 is divided into three pieces, the division pieces are denoted by 31 to 33. In the case where the inner heater block 3 is divided into "n" pieces which is not shown, the division pieces are denoted by 31 to 3n ("n" is an integer of 2 or more). The material of each of the division pieces 31 to 3n of the inner heater block 3 is aluminum in the present embodiment. The reason for this is because aluminum has many advantages such as a low density, a high heat conductivity, low cost, ease of machining, and a certain degree of corrosion resistance. As a matter of course, materials other than aluminum can be used. Metals having high heat conductivities such as copper, brass, iron, and stainless steel can be used. This feature applies also to the above outer heater block 5.

The outer surface of the inner heater block 3 in which the division pieces 31 to 3n have been assembled has a shape matching with the shape of the inner surface of the inner tube 2 and is expanded in a radial direction by elastic materials 8 (described later) so that the outer surface of each of the division pieces 31 to 3n is pressed against the inner surface of the inner tube 2. In this case, if the division pieces 31 to 3n are formed such that the curvatures of the outer peripheral surfaces thereof at the time of heating to a fixed temperature (the vaporization temperature of the liquid material L) match with the curvature of the inner surface of the inner tube 2, the entire outer peripheral surfaces of the division pieces 31 to 3n composing the inner heater block 3 are brought into contact with the inner surface of the inner tube 2 when a temperature (the vaporization temperature of the liquid material L) required for use is obtained.

As described above, the inner heater block 3 can be divided into a plurality of pieces. Here, description will be given with a focus placed on the inner heater block 3 divided into three pieces. Inner heaters 91 to 93 are respectively inserted in division pieces 31 to 33 obtained by dividing the inner heater block 3 into three pieces, and temperature sensors 101 to 103 are also respectively inserted in the division pieces 31 to 33.

Gaps C are provided between facing surfaces 31m to 33m of the division pieces 31 to 33 each having a cross section with a fan shape, and spring accommodating holes 35 are provided in the above facing surfaces 31m to 33m, at locations facing each other. The spring accommodating holes 35 are provided as pairs at a front end portion and a rear end portion of the inner heater block 3. One pair is provided in each of the three gaps C. Thus, three sets are provided.

The elastic materials 8 are accommodated inside the spring accommodating holes 35 of the division pieces 31 to 33. The elastic materials 8 press and urge the division pieces 31 to 33 in directions in which the gaps C between the facing surfaces 31m to 33m of the division pieces 31 to 33 are widened. Here, coil springs each formed from a material having excellent heat resistance are used. As elastic materials 8 other than coil springs, waved washers, plate springs, or the like can also be used.

As elastomeric force of each elastic material 8, a strength is selected such that the inner tube 2 is not damaged. Further, a heat-conductive paste having favorable heat conduction property can also be applied so as to fill the gaps C between the facing surfaces 31m to 33m of the division pieces 31 to 33 in order to improve the efficiency of heat conduction.

At least three minute projections 6 are provided on the same circumference of the outer peripheral surface of the inner tube 2, at each of the front end portion and the rear end portion. That is, two rows of the minute projections 6 are annularly provided on front and rear sides, respectively. When the inner tube 2 is inserted in the outer tube 1, the minute projections 6 come into contact with the inner peripheral surface of the outer tube 1, and a vaporization gap R which is even and sufficiently narrow is formed over the entire circumference between the inner tube 2 and the outer tube 1. As described above, the vaporization gap R leads to the exit nozzle 11 on the rear end side of the outer tube 1. The exit nozzle 11 is connected to, for example, a reaction furnace H for oxidation of silicon substrates.

Although the width W of the vaporization gap R is not particularly limited, the width W is, in terms of vaporization efficiency, preferably set to a range in which a thermal boundary layer having a high heat transfer coefficient is formed. That is, if the temperature of the outer peripheral surface of the inner tube 2 or the inner peripheral surface of the outer tube 1 is defined as a wall temperature, a fluid temperature gradually decreases in a direction away from the wall surfaces and becomes a fixed temperature (uniform flow temperature) at a certain location. The range from the wall surface to the location at which the fluid temperature becomes the fixed temperature, is the thermal boundary layer. The width W of the vaporization gap R is preferably set to this range. Consequently, the temperature of a passing fluid Q flowing in the vaporization gap R is kept at a temperature that is approximate to the wall temperature.

Opened ends on a heater-insertion side of the inner tube 2 and the outer tube 1 are fused together over the entire circumferences thereof, and an opened-side end portion on the heater-insertion side of the vaporization gap R is closed over the entire circumference thereof. The front end head portion 2a of the inner tube 2 accommodated in the outer tube 1 is oriented in a direction toward the spraying port 73, and an atomization space M is provided between the front end head portion 2a and the closed end 1a which is provided with the spraying port 73. Further, the vaporization gap R is, over the entire circumference thereof, in communication with the atomization space M.

An electric heater is used as a heat source, and, in the embodiment shown in the drawings, the inner heater 9 and the outer heater 4 are used. As a matter of course, it is also possible to provide merely the inner heater 9 as long as the inner heater 9 provides sufficient heating. As described above, the inner heater 9 is inserted in each of the division pieces 31 to 33, and the inserted inner heaters are respectively denoted by reference characters 91 to 93.

Meanwhile, in a conventional configuration, the outer diameter of the inner heater block 3 is set relative to the inner diameter of the inner tube 2 having a low thermal expansion coefficient, in consideration of thermal expansion of the inner heater block 3, and thus a large air gap is generated between the inner heater block 3 and the inner tube 2, and there is no choice but to use a large amount of heat-conductive paste for adhesion. In contrast, in the present invention, the entire outer peripheral surfaces of the division pieces 31 to 33 of the inner heater block 3 are pressed against and brought into contact with the inner peripheral surface of the inner tube 2, and thus, in principle, no heat-conductive paste needs to be used. Meanwhile, although the division pieces 31 to 33 of the inner heater block 3 are each a product obtained by machining a metal material and thus are finished so as to have an accurate external shape, the inner tube 2 is a heat-resistant glass (quartz glass), whereby the accuracy of processing the inner tube 2 is inferior to the accuracy of the machining. Therefore, it is permissible to use a heat-conductive paste in a very small amount such that, even if the heat-conductive paste degenerates owing to heat, the heat conduction property of the entirety is not impaired.

Regarding the temperature sensor 10, the temperature sensors 101 to 103 are respectively provided for the inner heaters 91 to 93 and individually control the temperatures of the inner heaters 91 to 93. The outer heater 4 may be controlled in accordance with any of the temperature sensors 101 to 103 for the inner heaters 91 to 93 or may be controlled in accordance with a calculated average value among the three temperature sensors 101 to 103. As a matter of course, the temperature sensor 12 may be uniquely prepared for the outer heater 4. Here, a case where the temperature sensor 12 is uniquely provided will be described. Since the outer heater 4 is divided correspondingly to the outer heater block 5, the temperature sensor 12 is also individually prepared.

Next, actions of the vaporizer A of the present invention will be described. FIG. 4 shows an example of a device configuration of a semiconductor manufacturing device in which the vaporizer A of the present invention is used. The semiconductor manufacturing device is composed of: a material tank T in which the liquid material L (in the present embodiment, a hydrogen peroxide solution) is stored and from which the liquid material L is sent out by means of pressurized gas G0; the liquid flow rate controller E connected to the material tank T and configured to send out the supplied liquid material L in a fixed flow rate; a mass flow rate controller S connected to a supply source for atomization gases such as nitrogen gas and oxygen gas and configured to send out each of these atomization gases G1 in a mass flow rate; the atomizer 7 composed of the liquid material introduction tube 7b configured to receive the liquid material L sent out from the liquid flow rate controller E and the spraying gas tube 7a configured to receive the atomization gas G1 from the mass flow rate controller S; and the vaporizer A having an entrance portion equipped with the atomizer 7, and configured to stably supply a fixed amount of the vaporization gas G2 (in the present embodiment, a hydrogen-peroxide-containing water vapor gas) to, for example, the reaction furnace H for oxidation of silicon substrates.

In the device A, when the heaters 4 (9) are energized, the heaters 4 (9) generate heat so that: the inner heater block 3 is heated in the inner tube 2; and the outer heater block 5 is heated in the outer tube 1.

In the inner tube 2 made of a heat-resistant glass, the division pieces 31 to 33 of the inner heater block 3 gradually undergo thermal expansion in association with temperature rise. Meanwhile, the inner tube 2 hardly undergoes thermal expansion, and the inner diameter thereof is kept substantially fixed. The outer peripheral surfaces of the division pieces 31 to 33 are pressed against the inner peripheral surface of the inner tube 2, and the division pieces 31 to 33 having undergone thermal expansion swell in directions in which the gaps C between the facing surfaces 31m to 33m are narrowed, whereby the division pieces 31 to 33 squeeze the elastic materials 8. As already mentioned, as the elastomeric force of each elastic material 8, an elastomeric force that is sufficiently weak and that falls within a range for preventing damage to the inner tube 2, is selected.

Then, when the heated outer heater block 5 and the heated inner heater block 3 heat the outer tube 1 and the inner tube 2 to a predetermined temperature, the liquid material L (in the present embodiment, a hydrogen peroxide solution) is supplied into the auxiliary supply hole 7d of the atomizer 7, and concurrently, the atomization gas G1 is injected to the main supply hole 7c. Consequently, the liquid material L in the form of a spray fluid K is blown into the atomization space M from the spraying port 73.

The spray fluid K impacts the spherical front end head portion 2a of the inner tube 2 and advances in the vaporization gap R toward the exit nozzle 11 while the spray fluid K is swirling around the inner tube 2. That is, the spray fluid K generates a swirl flow in the vaporization gap R. Thus, a sufficient heating time can be ensured. During this swirling, if the entire vaporization gap R is the thermal boundary layer, the swirl flow is heated to a temperature approximate to the wall temperature and is rapidly vaporized. Consequently, the swirl flow turns into vaporization gas G2. The vaporization gas G2 is discharged from the exit nozzle 11 and supplied to the reaction furnace H.

Since the entire outer peripheral surfaces of the division pieces 31 to 33 of the above inner heater block 3 are in contact with the inner peripheral surface of the inner tube 2 with no gap therebetween (or are in contact with the inner peripheral surface of the inner tube 2 with a very small amount of heat-conductive paste therebetween), heat from the division pieces 31 to 33 is efficiently transmitted to the inner tube (quartz glass tube) 2. In this case, since a heat-conductive paste such as a conventional one is not used in this portion (even if a very small amount of heat-conductive paste is used, the amount is an amount with which deterioration of the heat-conductive paste does not lead to impairment of heat conduction property), a higher temperature can be achieved than in a conventional configuration. As a result, the vaporization efficiency for the liquid material L is remarkably improved, and the vaporization-enabling flow rate of the liquid material L is dramatically increased as compared to a conventional configuration (if a very small amount of heat-conductive paste is used, the temperature rise of the inner tube 2 is preferably up to the heat-resistant temperature of the heat-conductive paste).

If the atomizer 7, the outer tube 1, and the inner tube 2 of the above vaporizer A are formed of "quartz glass", even when the liquid material L is a hydrogen peroxide solution, they are not contaminated and thus are applicable to oxidation of a surface of a silicon substrate.

REFERENCE SIGNS LIST

A vaporizer
Ah vaporizer body
Ak heating portion
C gap
CL center axis
E liquid flow rate controller
G0 pressurized gas
G1 atomization gas
G2 vaporization gas
H reaction furnace
K spray fluid
L liquid material
M atomization space
Q passing fluid
R vaporization gap
S mass flow rate controller
T material tank
W width of vaporization gap
1 outer tube
1a closed end
2 inner tube
2a front end head portion
3 inner heater block
4 outer heater
5 outer heater block
6 projection
7 atomizer
7a spraying gas tube
7b liquid material introduction tube
7c main supply hole
7d auxiliary supply hole
8 elastic material
9(91 to 93) inner heater
10(101 to 103) temperature sensor
11 exit nozzle
12 temperature sensor
31 to 3n division piece
31m to 33m facing surface
35 spring accommodating hole
41, 42 division piece of outer heater
51, 52 division piece of outer heater block
73 spraying port
80 fixation band
101 to 103 temperature sensor

The invention claimed is:
1. A vaporizer comprising:
an atomizer configured to atomize and spout a liquid material;
a vaporizer body which is hollow, the vaporizer body having one end to which a spraying port of the atomizer is connected, the vaporizer body having, at another end thereof, an exit nozzle which is an exit for vaporization gas; and
a heating portion accommodated in the vaporizer body, wherein
the heating portion comprises
an inner tube made of a heat-resistant glass, the inner tube having an outer diameter smaller than an inner diameter of the vaporizer body, the inner tube having a front end head portion which is an insertion end and which is closed,
an inner heater block inserted in the inner tube, and
an inner heater embedded in the inner heater block,
the exit nozzle is provided so as to be in communication with a vaporization gap formed between an inner peripheral surface of the vaporizer body and an outer peripheral surface of the inner tube,
the inner heater block comprises
a plurality of division pieces obtained by dividing the inner heater block along a center axis of the inner heater block and
an elastic material,
the elastic material is disposed between the division pieces and acts so as to press and urge the division pieces in separation directions and press outer peripheral surfaces of the division pieces against an inner peripheral surface of the inner tube, and
the inner heater is embedded in each division piece.
2. The vaporizer according to claim 1, wherein the heat-resistant glass is quartz glass.

* * * * *